(12) United States Patent
Ransom

(10) Patent No.: US 9,428,062 B2
(45) Date of Patent: Aug. 30, 2016

(54) DUTY CYCLE UPDATES FOR A POWER CONVERTER

(71) Applicant: GM GLOBAL TECHNOLOGY OPERATIONS LLC, Detroit, MI (US)

(72) Inventor: Ray M. Ransom, Big Bear City, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 43 days.

(21) Appl. No.: 14/533,877

(22) Filed: Nov. 5, 2014

(65) Prior Publication Data

US 2015/0306962 A1 Oct. 29, 2015

Related U.S. Application Data

(60) Provisional application No. 61/983,017, filed on Apr. 23, 2014.

(51) Int. Cl.
| | |
|---|---|
| *H02P 1/30* | (2006.01) |
| *B60L 11/00* | (2006.01) |
| *H03K 3/017* | (2006.01) |
| *H03K 5/156* | (2006.01) |
| *H02M 1/15* | (2006.01) |
| *H02M 7/5395* | (2006.01) |

(52) U.S. Cl.
CPC ............ *B60L 11/00* (2013.01); *H02M 1/15* (2013.01); *H02M 7/5395* (2013.01); *H03K 3/017* (2013.01); *H03K 5/1565* (2013.01)

(58) Field of Classification Search
CPC .......... H02M 7/44; H02M 2001/0048; H03K 3/017; H03K 5/1565; B60L 11/00
See application file for complete search history.

(56) References Cited

U.S. PATENT DOCUMENTS

| | | | |
|---|---|---|---|
| 7,768,228 B2 | 8/2010 | Kajouke et al. | |
| 8,446,117 B2 | 5/2013 | Gallegos-Lopez et al. | |
| 2009/0153075 A1* | 6/2009 | Li | H05B 33/0818 315/294 |
| 2010/0073980 A1 | 3/2010 | Jang et al. | |

* cited by examiner

*Primary Examiner* — Karen Masih
(74) *Attorney, Agent, or Firm* — Lorenz & Kopf, LLP

(57) ABSTRACT

A method and system are provided for updating a duty cycle for a power converter. The system and method operate the power converter to compute a first duty cycle during a first pulse-width modulation period and updating a second duty cycle for a second pulse-width modulation period at the completion of the first pulse-width modulation period. Next a third duty cycle for a third previous pulse-width modulation period is updated at the completion of the first pulse-width modulation period.

20 Claims, 3 Drawing Sheets

DUTY CYCLE UPDATES FOR A POWER CONVERTER

CROSS REFERENCE TO RELATED APPLICATIONS

This application claims the benefit of U.S. Provisional Application No. 61/983,017 filed on Apr. 23, 2014.

TECHNICAL FIELD

The technical field generally relates to power converters, and more particularly relates to updating the duty cycle of a power converter.

BACKGROUND

Power converters are typically used in alternative fuel vehicles to convert the battery or fuel cell energy to alternating current (AC) power that is used by AC motors to propel the vehicle. In pulse-width modulated (PWM) power converters, a controller generates PWM command signals that controls the timing and duty cycles of switches in the power converter to provide multi-phase (e.g., three-phase) power to the motors. However, due to the time period allocated or available for duty cycle calculations being a fraction of the total PWM period in multi-phase power converters, it is not possible to update duty cycle calculations without the risk of overwriting previously scheduled PWM transitions. Overwriting previously scheduled PWM transitions may cause power ripples that could damage or reduce the life of fuel cells.

Accordingly, it is desirable to provide a method for updating duty cycles in a multi-phase power converter without incurring the risk of overwriting previously scheduled PWM transitions. Furthermore, other desirable features and characteristics of the present invention will become apparent from the subsequent detailed description and the appended claims, taken in conjunction with the accompanying drawings and the foregoing technical field and background.

SUMMARY

A system is provided for updating the duty cycle of a power converter. In one embodiment, the apparatus includes an energy source and a power converter coupled to the energy source for converting energy from the energy source into multi-phase power signals. A pulse-width modulator provides pulse-width modulation control signals to the power converter and a controller provides duty cycle information for each of the multi-phase power signals. The controller computes first duty cycle information during a first pulse-width modulation period and updates second duty cycle information for a second pulse-width modulation period at the completion of the first pulse-width modulation period. The controller also updates third duty cycle information for a third previous pulse-width modulation period at the completion of the first pulse-width modulation period.

A method is provided for duty cycle updates for a power converter. In one embodiment, the method includes computing a first duty cycle during a first pulse-width modulation period and updating a second duty cycle for a second pulse-width modulation period at the completion of the first pulse-width modulation period. Next a third duty cycle for a third previous pulse-width modulation period is updated at the completion of the first pulse-width modulation period.

DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language.

Additionally, the following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that, although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Figure 2:
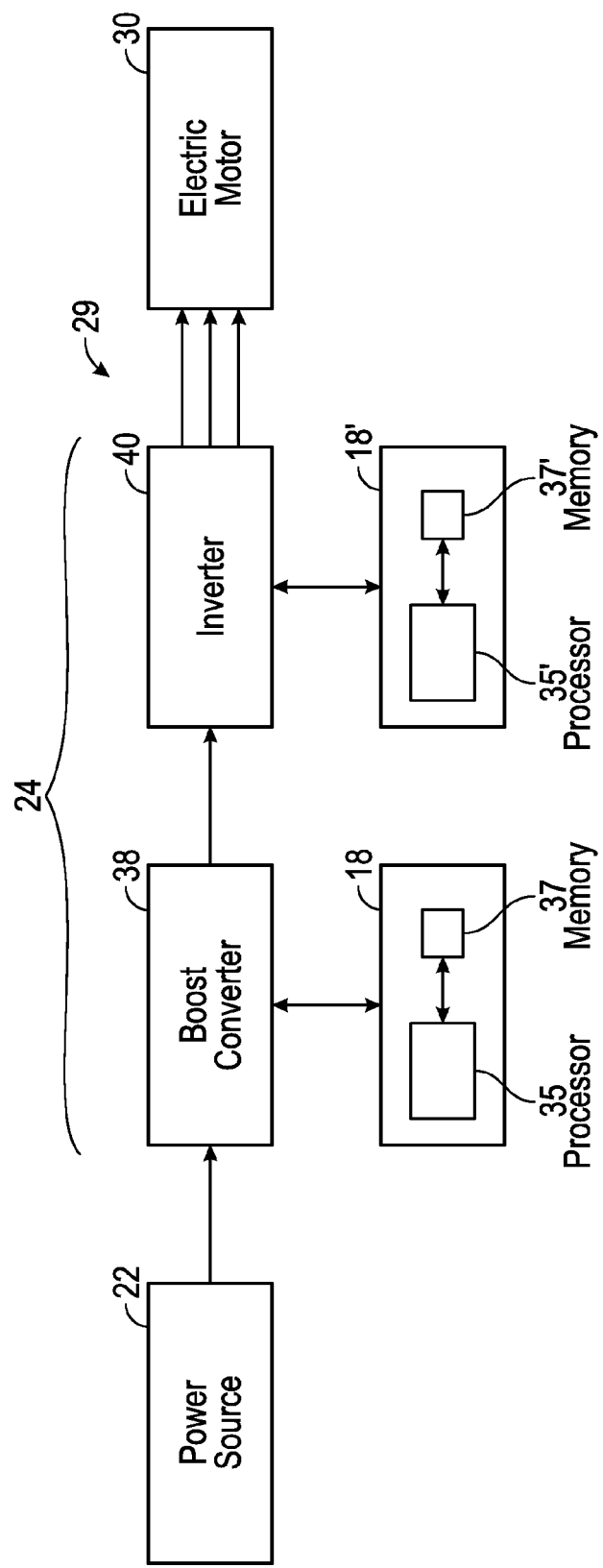
FIG. 2 is a block diagram of a power converter in accordance with an embodiment.
Figure 3:
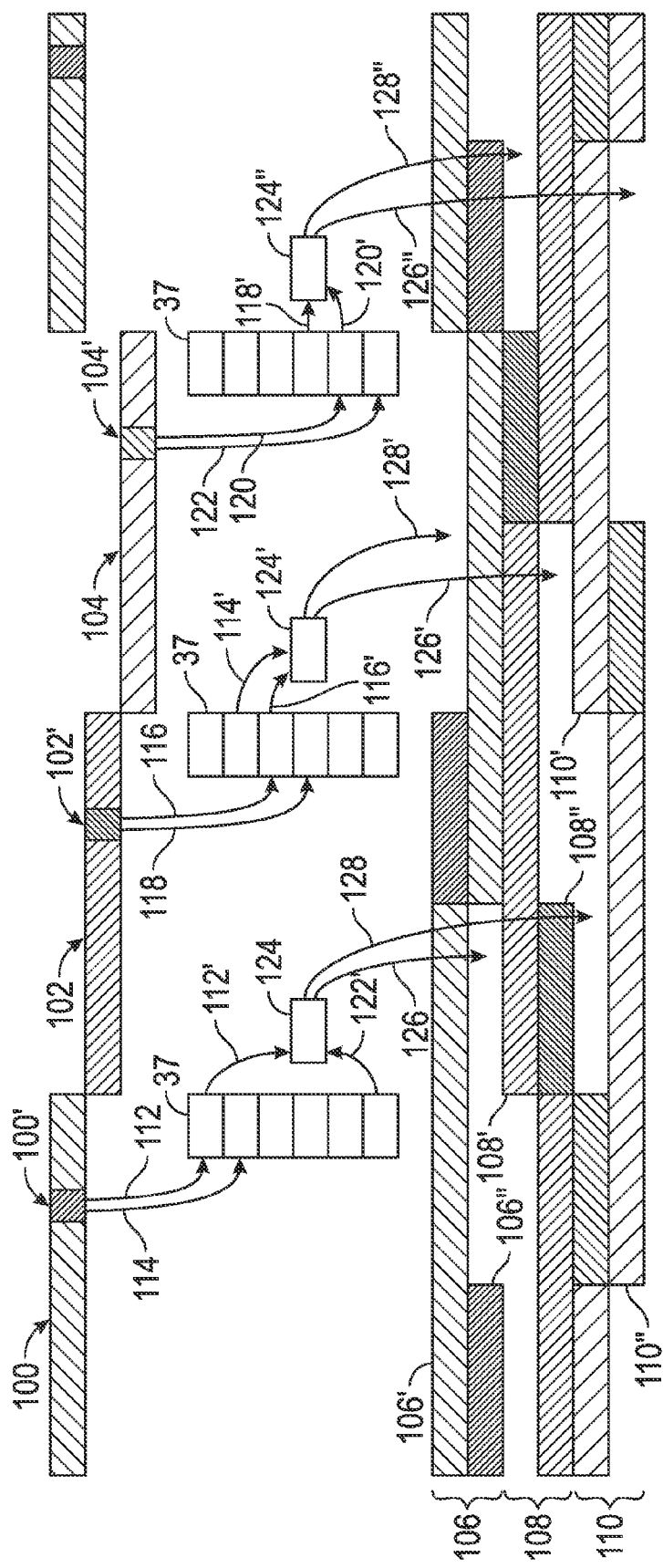
FIG. 3 is a timing diagram illustrating a duty cycle update method in accordance with an embodiment.

Finally, for the sake of brevity, conventional techniques and components related to vehicle electrical and mechanical parts and other functional aspects of the system (and the individual operating components of the system) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention. It should also be understood that FIGS. 1-3 are merely illustrative and may not be drawn to scale.

Figure 1:
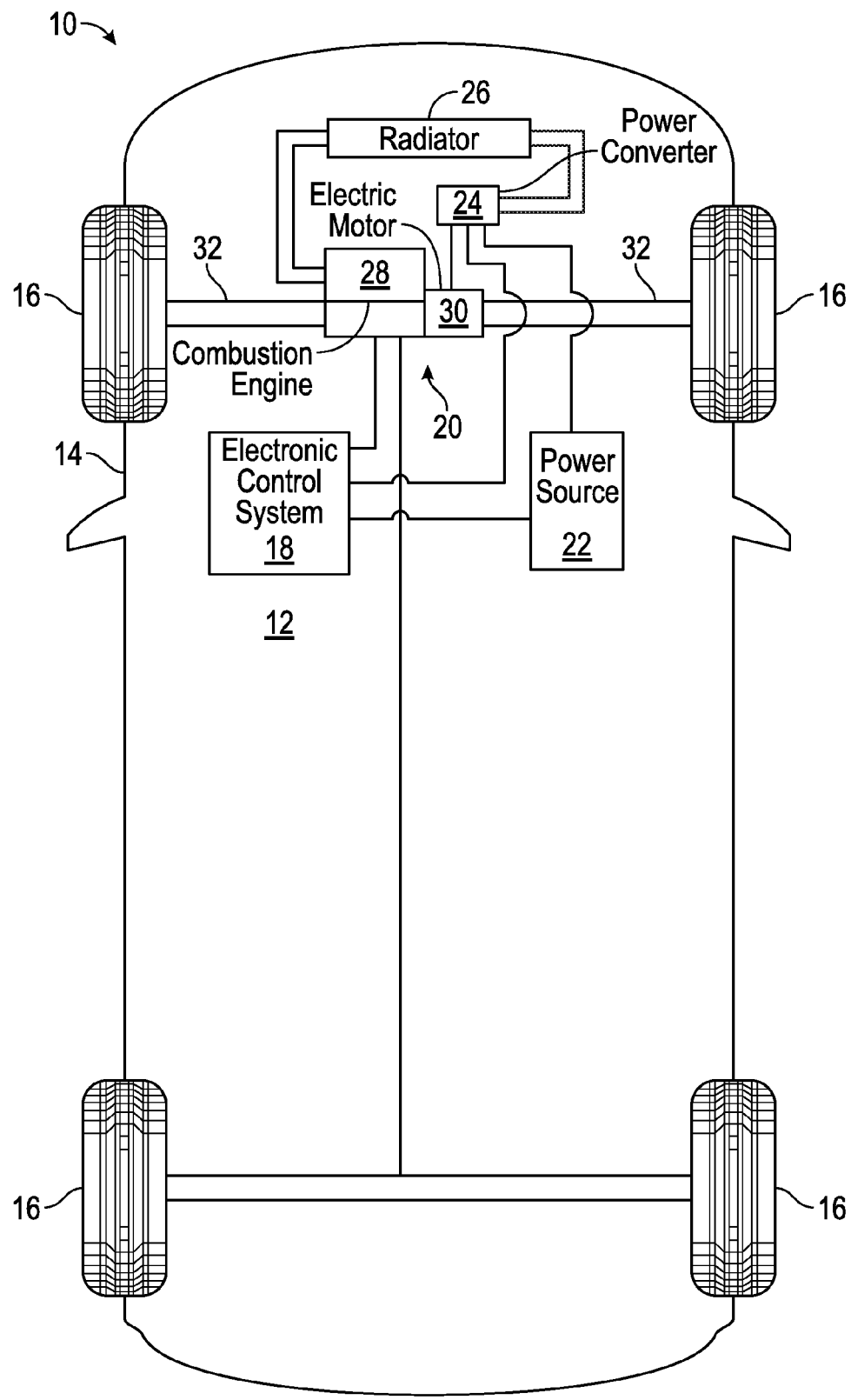
FIG. 1 is a block diagram of a vehicle in accordance with an embodiment.

FIG. 1 illustrates a vehicle 10, according to one embodiment of the present invention. The vehicle 10 includes a chassis 12, a body 14, four wheels 16, and an electronic control system 18. The body 14 is arranged on the chassis 12 and substantially encloses the other components of the vehicle 10. The body 14 and the chassis 12 may jointly form a frame. The wheels 16 are each rotationally coupled to the chassis 12 near a respective corner of the body 14.

The vehicle 10 may be any one of a number of different types of vehicle, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the vehicle 10 is a hybrid vehicle, and further includes an actuator assembly 20, a battery, fuel cell or a high voltage direct current (DC) power source 22, a power converter assembly 24, and a radiator 26. The actuator assembly 20 includes a combustion engine 28 (in hybrid vehicle embodiments) and an electric motor/generator (or motor) 30. As will be appreciated, the electric motor 30 includes a transmission therein, and although not illustrated also includes a stator assembly (including conductive coils), a rotor assembly (including a ferromagnetic core), and a cooling fluid (i.e., coolant). The stator assembly and/or the rotor assembly within the electric motor 30 may include multiple electromagnetic poles (e.g., sixteen poles), as is commonly understood.

Still referring to FIG. 1, in one embodiment, the combustion engine 28 and the electric motor 30 are integrated such that both are mechanically coupled to at least some of the wheels 16 through one or more drive shafts 32. The radiator 26 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 28 and the inverter 24. In exemplary embodiments, the power converter assembly 24 comprises a direct current-to-direct current (DC/DC) converters boost converter to raise the input voltage provided by the DC power source (e.g., battery or fuel cell) that is provided to a multi-phase motor (e.g., three phases) via an inverter.

Referring to FIG. 2, a power converter system 24, in accordance with an exemplary embodiment of the present invention, is shown. The power converter system 24 includes a boost converter 38 coupled to a power source 22 and to an inverter 40. The boost converter 38 and the inverter 40 each communicate with the electronic control system(s) 18 and 18' respectively. In some embodiments the electronic control system(s) 18 and 18' are independent systems. As will be appreciated, in other embodiments, the control system(s) could be a common control system, different cores of a multi-core processor or processor operating in a distributed processing system. The electronic control system 18 (or 18') includes a processor 35 (or 35') coupled to a memory 37 (or 37'). The processor 35 computes duty cycle information for boost converter that are stored in the memory 37 and provided to the boost converter as will be described below in connection with FIG. 3. The boost converter 38 is coupled to an input of the inverter 40 that provides multi-phase (e.g., three phase) power to a motor 30 via lines 29. Although the exemplary embodiment of FIG. 2 utilizes three phases, it will be appreciated that any number of phases for the multi-phase motor 30.

FIG. 3 illustrates a timing diagram useful for understanding the duty cycle update method provided by the present disclosure. The various tasks performed in connection with the method of FIG. 3 may be performed by software, hardware, firmware, or any combination thereof. For illustrative purposes, the following description of the method of FIG. 3 may refer to elements mentioned above in connection with FIGS. 1-2. In practice, portions of the method of FIG. 3 may be performed by different elements of the described system. It should also be appreciated that the method of FIG. 3 may include any number of additional or alternative tasks and that the method of FIG. 3 may be incorporated into a more comprehensive procedure or process having additional functionality not described in detail herein.

The example of FIG. 3 also illustrates a three phase (A, B and C) exemplary embodiment, however, it will be appreciated that any number of phases may be employed in any particular implementation. In FIG. 3, three duty cycle calculation periods 100, 102 and 104 are illustrated. Duty cycle information is computed during these periods for each of three PWM periods 106, 108 and 110. More specifically, a trailing edge time 106', 108' and 110' and a leading edge time 106", 108" and 110" are computed. The leading edge time and trailing time define a duty cycle time interval during which switches within the boost converter 38 are open and closed to generate the higher power signal for the inverter 40. At some point (100') during the duty cycle calculation period 100 for the next PWM A, a beginning time 112 and ending time 114 are computed by the processor (35 in FIG. 2) and stored in memory (37 in FIG. 2). After completion of the PWM duty cycle calculation period 100 (for the next PWM A) and during the PWM duty cycle calculation period 102 (for the next PWM B) the processor 35 retrieves from the memory 37 the beginning time for the next PWM A 112' and the ending time for the current PWM C 122' (previously stored in prior PWM duty cycle calculation periods) and uses this duty cycle information to write from block 124 a leading edge time 126 computed in the previous PWM duty cycle calculation period for the next PWM A 106" and a trailing edge time 128 computed in the PWM duty cycle calculation period two cycles previous for the next PWM C 110'. More specifically, the beginning time 112' for the next PWM A is used to update the leading edge time 106" for the next PWM A and the ending time 122' for the current PWM C is used to update the trailing edge time 110" for the current PWM C. The update operation (block 124) may be implemented in some embodiments are a direct memory access (DMA) operation, may be implemented as a part of the interrupt service routine (ISR) which invokes PWM duty cycle calculation period B 102 or as a portion of the PWM duty cycle calculation routine itself.

In a similar manner, at some point (102') during the duty cycle calculation period 102 for the next PWM B, a beginning time 116 and ending time 118 are computed by the processor (35 in FIG. 2) and stored in memory (37 in FIG. 2). After completion of the PWM duty cycle calculation period 102 (for the next PWM B) and during PWM duty cycle calculation period 104 (for the next PWM C) the processor 35 retrieves from the memory 37 the beginning time for the next PWM B 116' and the ending time for the current PWM A 114' (previously stored as discussed above) and uses this duty cycle information to write from block 124' a leading edge time 126' computed in the previous PWM duty cycle calculation period for the next PWM B 108" and a trailing edge time 128' computed in the PWM duty cycle calculation period two cycles previous for the current PWM A 106'. More specifically, the beginning time 116' for PWM B is used to update the leading edge time 108" for the next PWM B and the ending time 114' for PWM A is used to update the trailing edge time 106' for the current PWM A.

Also in a similar manner, at some point (104') during the duty cycle calculation period 104 for PWM C, a beginning time 120 and ending time 122 are computed by the processor (35 in FIG. 2) and stored in memory (37 in FIG. 2). After completion of the PWM duty cycle calculation period 104 (for the next PWM C) and during PWM duty cycle calculation period 100 (for the next PWM A) the processor 35 retrieves from the memory 37 the beginning time for the next PWM C 120' and the ending time for the current PWM B 118' (previously stored as discussed above) and uses this duty cycle information to write from block 124" a leading edge time 126" computed in the previous PWM duty cycle calculation period for the next PWM C 110" and a trailing edge time 128" computed in the PWM duty cycle calculation period two cycles previous for the current PWM B 108'. More specifically, the beginning time 120' for the next PWM C is used to update the leading edge time 110" for PWM C and the ending time 118' for the current PWM B is used to update the trailing edge time 108' for the current PWM B.

In summary, during any particular PWM duty cycle calculation period, beginning and ending times for the next corresponding PWM are computed and stored in memory. After completion of this PWM duty cycle calculation period, the leading edge time is updated for the next PWM corresponding to the previous duty cycle calculation period, and a trailing edge time is updated for the current PWM, the duty cycle of which was calculated two PWM duty cycle calculation periods previous. By writing these duty cycle update in this manner, overwriting PWM transitions is avoided by performing the writing operations when these PWM transitions cannot occur.

While at least one exemplary embodiment has been presented in the foregoing detailed description, it should be appreciated that a vast number of variations exist. For example, while the exemplary embodiment is described and illustrated as an automotive vehicle, the advantage afforded by the present disclosure would benefit any electric powered vehicle, including, but not limited to, off-road vehicles and watercraft. Moreover, any application involving a boost converter could benefit from the teachings of the present disclosure. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the appended claims and the legal equivalents thereof.

What is claimed is:

1. A method, comprising:
   computing a first duty cycle during a first pulse-width modulation period;
   updating a second duty cycle for a second pulse-width modulation period at the completion of the first pulse-width modulation period, the second pulse-width modulation period being just prior to the first pulse-width modulation period; and
   updating a third duty cycle for a third previous pulse-width modulation period at the completion of the first pulse-width modulation period, the third pulse-width modulation period being two periods prior to the first pulse-width modulation period.

2. The method of claim 1, wherein the updating of the second duty cycle comprises determining a trailing edge time for the second duty cycle.

3. The method of claim 1, wherein the updating of the third duty cycle comprises determining a leading edge time for the third duty cycle.

4. The method of claim 1, wherein the computing of the first duty cycle comprises determining a beginning time and an ending time for the first pulse-width modulation period.

5. The method of claim 4, including writing the beginning time and the ending time into a memory.

6. The method of claim 5, wherein the beginning time of the first pulse-width modulation period is read from the memory and used to determine a trailing edge time for the second pulse-width modulation period.

7. The method of claim 5, wherein an ending time of the third pulse-width modulation period is read from the memory and used to determine a leading edge time for the third pulse-width modulation period.

8. A system, comprising:
   an energy source;
   a power converter coupled to the energy source for converting energy from the energy source into multi-phase power signals;
   a pulse-width modulator coupled to the power converter and providing pulse-width modulation control signals to the power converter; and
   a controller coupled to the pulse-width modulator and providing duty cycle information for each of the multi-phase power signals;
   wherein, first duty cycle information is computed during a first pulse-width modulation period;
   wherein the controller updates second duty cycle information for a second pulse-width modulation period at the completion of the first pulse-width modulation period, the second pulse-width modulation period being just prior to the first pulse-width modulation period; and
   wherein the controller updates third duty cycle information for a third previous pulse-width modulation period at the completion of the first pulse-width modulation period, the third pulse-width modulation period being two periods prior to the first pulse-width modulation period.

9. The system of claim 8, wherein the controller updates the second duty cycle by determining a trailing edge time for the second duty cycle.

10. The system of claim 8, wherein the controller updates the third duty cycle by determining a leading edge time for the third duty cycle.

11. The system of claim 8, wherein the controller computes a beginning time and an ending time for the first pulse-width modulation period.

12. The system of claim 11, wherein the controller writes the beginning time and the ending time into a memory.

13. The system of claim 12, wherein the controller reads the beginning time of the first pulse-width modulation period from the memory and determines a trailing edge time for the second pulse-width modulation period.

14. The system of claim 12, wherein the controller reads an ending time of the third pulse-width modulation period from the memory and determines a leading edge time for the third pulse-width modulation period.

15. A vehicle, comprising:
   an energy source;

a power converter coupled to the energy source for converting energy from the energy source into multi-phase power signals;

a multi-phase motor coupled to the power converter and using the multi-phase power signals to propel the vehicle;

a pulse-width modulator coupled to the power converter and providing pulse-width modulation control signals to the power converter; and a controller coupled to the pulse-width modulator and providing duty cycle information for each of the multi-phase power signals;

wherein, first duty cycle information is computed during a first pulse-width modulation period;

wherein the controller updates second duty cycle information for a second pulse-width modulation period at the completion of the first pulse-width modulation period, the second pulse-width modulation period being just prior to the first pulse-width modulation period; and wherein the controller updates third duty cycle information for a third previous pulse-width modulation period at the completion of the first pulse-width modulation period, the third pulse-width modulation period being two periods prior to the first pulse-width modulation period.

16. The system of claim 15, wherein the controller updates the second duty cycle by determining a trailing edge time for the second duty cycle.

17. The system of claim 15, wherein the controller update the third duty cycle by determining a leading edge time for the third duty cycle.

18. The system of claim 15, wherein the controller computes a beginning time and an ending time for the first pulse-width modulation period.

19. The system of claim 18, wherein the controller writes the beginning time and the ending time into a memory.

20. The system of claim 19, wherein the controller reads the beginning time of the first pulse-width modulation period from the memory and determines a trailing edge time for the second pulse-width modulation period.

* * * * *